US009939074B2

(12) United States Patent
Svensson

(10) Patent No.: US 9,939,074 B2
(45) Date of Patent: Apr. 10, 2018

(54) ENABLING SECURED DEBUG OF AN INTEGRATED CIRCUIT

(71) Applicant: Telefonaktiebolaget LM Ericsson (Publ), Stockholm (SE)

(72) Inventor: Peter Svensson, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 173 days.

(21) Appl. No.: 14/913,615

(22) PCT Filed: Aug. 6, 2014

(86) PCT No.: PCT/EP2014/066918
§ 371 (c)(1),
(2) Date: Feb. 22, 2016

(87) PCT Pub. No.: WO2015/032571
PCT Pub. Date: Mar. 12, 2015

(65) Prior Publication Data
US 2017/0089477 A1     Mar. 30, 2017

(30) Foreign Application Priority Data

Sep. 3, 2013   (EP) .................................... 13182739

(51) Int. Cl.
*H04L 29/00*   (2006.01)
*F16K 25/04*   (2006.01)
(Continued)

(52) U.S. Cl.
CPC ............ *F16K 25/04* (2013.01); *B01J 8/0015* (2013.01); *F16K 3/02* (2013.01); *F16K 27/044* (2013.01);
(Continued)

(58) Field of Classification Search
CPC ................................ F16K 25/04; B01J 8/0015
(Continued)

(56) References Cited

U.S. PATENT DOCUMENTS 7,228,440 B1 * 6/2007 Giles ................ G01R 31/31719
713/168
2006/0282734 A1   12/2006   Milne et al.
2010/0088760 A1   4/2010   Greb et al.

FOREIGN PATENT DOCUMENTS

JP         2002358137 A     12/2002
JP         2007502462 A     2/2007
(Continued)

OTHER PUBLICATIONS

International Search Report and Written Opinion dated Oct. 22, 2014 for International Serial No. PCT/EP2014/066918, International Filing Date—Aug. 6, 2014 consisting of 9-pages.
(Continued)

*Primary Examiner* — Jeffrey Pwu
*Assistant Examiner* — Michael D Anderson
(74) *Attorney, Agent, or Firm* — Christopher & Weisberg, P.A.

(57) ABSTRACT

Secured debug of an integrated circuit having a test operation mode and a secure mission operation mode. The integrated circuit has a processing unit, a test interface through which the test operation mode is controllable, an on-chip memory which is accessible in the test operation mode and in the secure mission operation mode, and one or more protected resources inaccessible in the test operation mode. The processing unit is configured, in the test operation mode, to receive an authenticated object through the test interface, and store the received authenticated object in the on-chip memory. The processing unit is moreover configured, upon reset into the secure mission operation mode, to execute a boot procedure to determine that the authenticated
(Continued)

object is available in the on-chip memory, authenticate the authenticated object, and—upon successful authentication—render the more protected resources accessible to a debug host external to the integrated circuit.

20 Claims, 5 Drawing Sheets

(51) Int. Cl.
*B01J 8/00* (2006.01)
*F16K 3/02* (2006.01)
*F16K 27/04* (2006.01)

(52) U.S. Cl.
CPC .............. *B01J 2208/00548* (2013.01); *B01J 2208/00787* (2013.01)

(58) Field of Classification Search
USPC .......................................................... 726/2
See application file for complete search history.

(56) References Cited

FOREIGN PATENT DOCUMENTS

| | | |
|---|---|---|
| JP | 2008152421 | 3/2008 |
| JP | 2009521772 A | 6/2009 |
| JP | 2009544069 A | 12/2009 |
| JP | 2011511383 A | 4/2011 |
| JP | 2011210037 A | 10/2011 |

OTHER PUBLICATIONS

Asaf Ashkenazi and Dmitry Akselrod: "Platform Independent Overall Security Architecture in Multi-Processor System-on-Chip Integrated Circuits for use in Mobile Phones and Handheld Devices," Published in: Computers & Electrical Engineering, vol. 33(5-6):407-424, Jul. 23, 2007 consisting of 18-pages.

Japanese Office Action and English Translation dated Feb. 21, 2017 for Application No. JP 2016-539449, filed on Feb. 29, 2015 consisting of 12-pages.

* cited by examiner

ENABLING SECURED DEBUG OF AN INTEGRATED CIRCUIT

TECHNICAL FIELD

This disclosure relates to the field of integrated circuits and, in particular, to an integrated circuit being configured for enabling secured debug from an external debug host. This disclosure also relates to an associated method for enabling secured debug of such an integrated circuit.

BACKGROUND

Integrated circuits are nowadays used in virtually all kinds of electronic apparatuses. In more advanced forms, the integrated circuit contains programmable logic circuitry (i.e. a processing unit), associated volatile and non-volatile memories, and function-specific circuitry (for instance, radio communication circuitry). Such an integrated circuit is sometimes referred to as a digital System On Chip (SOC).

One common kind of electronic apparatuses where integrated circuits such as digital SOCs are used is a mobile terminal for radio communication pursuant to one or more standards for mobile telecommunication such as, for instance, one or more of GSM, UMTS, LTE, D-AMPS, CDMA2000, FOMA or TD-SCDMA. A mobile terminal will be used herein as a non-limiting example of an electronic apparatus comprising an integrated circuit according to the present disclosure.

A mobile terminal often is required to operate in a well-defined fashion, typically due to:

1. standards requirements (such as radio interface requirements)
2. third-party requirements (such as Digital Rights Management (DRM))
3. security requirements (such as preventing malicious software, for instance in the form of a trojan or a virus-infected software) from running or at least accessing protected resources.

An integrated circuit (e.g. SOC) contained in the mobile terminal is of course also subjected to such requirements, where applicable. This means that the integrated circuit needs to authenticate new or modified program code that an external device is trying to upload to the integrated circuit. The integrated circuit also needs to verify that an external device, when seeking access to protected resources on the integrated circuit, actually has the authority to do so.

One situation where the above considerations become an issue is testing of integrated circuits. As with any semiconductor devices, mass-production of integrated circuits will not be perfectly free from errors. Hence, test methods and devices are needed. An industry standard known as Joint Test Action Group (JTAG) is available for this purpose. To facilitate testing, an integrated circuit is often provided with a JTAG compliant interface, such as IEEE 1149.1 or IEEE 1149.7.

Generally, testing of integrated circuits can be divided in two main types, production-line testing and field return testing.

Production-line testing occurs en masse for a large number of integrated circuit at the production plant. An external device is connected to the JTAG interface of the integrated circuit and performs low-level testing activities such as boundary scan testing. In addition, integrated circuits are often designed to have a test operation mode called Functional Test Vectors (FTV). FTV mode allows further examination of an integrated circuit by running certain program code on the integrated circuit under control from the external device, which is often referred to as debug host (or debug tool). Production-line testing is time-critical (delays in production time is expensive); therefore FTV mode testing is normally limited to a short testing period of a few seconds or so.

On the other hand, FTV mode production-line testing does not pose a particular security problem, since it takes place at the production plant. For performance reasons, no authentication of the debug host is used in FTV mode. However, since it might be possible for third parties to perform FTV mode testing on an integrated circuit once released on the field, the integrated circuit is normally designed to disable certain sensitive features when run in FTV mode. Several examples of such sensitive features are given later on in the Detailed Description section and are collectively referred to as protected resources in this disclosure.

Field return testing of faulty samples of the integrated circuit (and/or the electronic apparatus it is part of) often requires manual investigation of reported problems. Such investigation requires debugging and checking all on-chip functions. Since integrated circuits are typically locked down after completion at the production line, an integrated circuit being subjected to field return testing needs to verify that a debug host is authentic, and/or actually has the authority to command debug operations—particularly those which pertain to protected resources on the integrated circuit. Otherwise, a severe security risk appears.

Another situation where the above security considerations become an issue is the enabling of secured debug during development. If a debug operation involves uploading of new or updated program code onto the integrated circuit, the integrated circuit needs to authenticate the uploaded program code, before storing or at least running it.

In order for such authentication, authorization or uploading of program code to be possible, authentication data, authorization data or program code must be transferred onto the integrated circuit from the outside. Such uploading may however be problematic. Even though the integrated circuit typically has standard functional interfaces like UART or USB, those interfaces are often already connected to a host device (such as an application processor) in the electronic apparatus. Host device support to provide the required data upload may not be present.

One approach might be to add extra components, allowing a debug host to break up for instance a UART link between the integrated circuit and the host device. Adding extra components however is difficult because of constraints in space/circuit area as well as costs. Such an approach might also require that the interface (e.g. UART) at some point be switched from the debug host to the on-PCB host, which requires synchronization between the debug host and the host device in the electronic apparatus.

In fact, for certain minimized integrated circuits with small form factors, it may not even be possible to add extra connectors for a UART or USB interface.

A further complication is that some on-chip interfaces may have been permanently disabled for functional reasons. For example, a certain customer of an integrated circuit manufacturer may have chosen to disable boot over UART, in case that would otherwise interfere with the particular use of the corresponding interface pins that the customer has in mind.

As is apparent from the above, there are both needs and room for improvements with respect to these problems.

SUMMARY

An object of the present disclosure is to solve or at least mitigate on or more problems which have been identified in the background art.

The present inventor has realized that secured debug of an integrated circuit can be obtained by using a test interface (such as JTAG) of the integrated circuit in a novel, two-stage manner. First, the data required by the integrated circuit to verify the debug host as trusted is uploaded in an on-chip memory of the integrated circuit ahead of the main boot. The main boot is then informed that the data is pre-loaded in the on-chip memory. The main boot then evaluates the data and takes appropriate action to render protected on-chip resources available to the debug host, if deemed trusted in view of the pre-loaded data in the on-chip memory. All these transactions can be performed via the JTAG interface and no other conventional interfaces need to be existing or involved.

This understanding by the inventor has been reduced to practice at least according to the inventive aspects and embodiments referred to below.

One aspect of the present disclosure therefore is an integrated circuit having a test operation mode and a secure mission operation mode. The integrated circuit comprises a processing unit, a test interface through which the test operation mode is controllable, an on-chip memory which is accessible in the test operation mode and in the secure mission operation mode, and one or more protected resources being inaccessible in the test operation mode. The processing unit is configured, in the test operation mode, to receive an authenticated object through said test interface, and store the received authenticated object in the on-chip memory. The processing unit is configured, upon reset into the secure mission operation mode, to execute a boot procedure so as to determine that the authenticated object is available in the on-chip memory, authenticate the authenticated object, and—upon successful authentication—render the one or more protected resources accessible to a debug host external to the integrated circuit.

The test interface is advantageously Joint Test Action Group (JTAG) compliant, and the test operation mode is advantageously a Functional Test Vectors (FTV) mode. Hence, beneficial use is made of an already existing test interface on many if not all integrated circuits.

The integrated circuit may be further configured to accept writing of specific data in an on-chip register so as to indicate that the authenticated object has been stored in the on-chip memory. The boot procedure may thus check the contents of the on-chip register and, upon finding of the specific data therein, determine that the authenticated object is available in the on-chip memory.

The on-chip register may conveniently be a JTAG Test Access Point (TAP), wherein the specific data may be a flag.

At least part of the boot procedure may be defined by program code comprised in a non-volatile boot memory (such as a ROM), which is inaccessible in the test operation mode and accessible in the secure mission operation mode.

The authenticated object may, for instance, comprise signed computer program code defining a debug procedure to be executed by the processing unit under control from the debug host.

The authenticated object may also or instead comprise authentication data identifying the debug host as trusted.

The authenticated object may also or instead comprise authorization data defining a permission to render the one or more protected resources accessible to the debug host.

In one or more embodiments, the protected resources may comprise one or more of:

a secured memory area of the integrated circuit, such as all or some of the aforementioned boot memory, a debug function, for instance part of the aforementioned debug procedure, a Digital Rights Management (DRM) key, a Subscriber Identity Module (SIM) function, an International Mobile Equipment Identity (IMEI) storage, a radio frequency component, an encryption key, a decryption key, a clock signal generator, and a reset mechanism.

Advantageously, the integrated circuit further comprises radio communication circuitry for communication pursuant to one or more standards for mobile telecommunication.

Advantageously, the integrated circuit is a digital System On Chip (SOC).

A second aspect of the present disclosure is an electronic apparatus which comprises an integrated circuit according to the first aspect.

A third aspect of the present disclosure is a mobile terminal which comprises an integrated circuit according to the first aspect.

A fourth aspect of the present disclosure is a method of enabling secured debug of an integrated circuit (100; 300). The method involves:

resetting the integrated circuit to operate in a test operation mode in which one or more protected resources of the integrated circuit is inaccessible;

receiving an authenticated object through a test interface of the integrated circuit;

storing the received authenticated object in an on-chip memory of the integrated circuit; and resetting the integrated circuit to operate in a secure mission operation mode by executing a boot procedure which involves:

determining that the authenticated object is available in the on-chip memory;

authenticating the authenticated object; and upon successful authentication, rendering the one or more protected resources accessible to a debug host external to the integrated circuit.

The method according to the fourth aspect may further involve any or all steps which are the direct functional counterpart of the structural features of the integrated circuit according to the first aspect.

Other features and advantages of the present disclosure will appear from the following detailed disclosure, from the attached dependent claims as well as from the drawings.

Generally, all terms used in the claims are to be interpreted according to their ordinary meaning in the technical field, unless explicitly defined otherwise herein.

All references to "a/an/the [element, device, component, means, step, etc]" are to be interpreted openly as referring to at least one instance of the element, device, component, means, step, etc., unless explicitly stated otherwise. The actions of any method disclosed herein do not have to be performed in the exact order disclosed, unless explicitly stated.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF DRAWINGS

Objects, features and advantages of the present disclosure will appear from the following detailed description, reference being made to the accompanying drawings.

DETAILED DESCRIPTION

Figure 1:
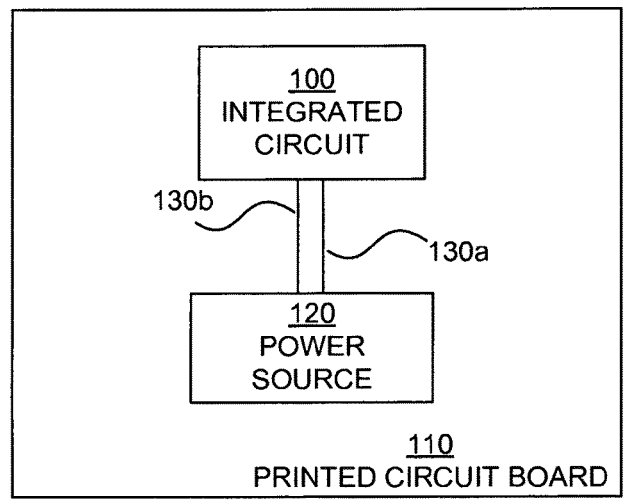
FIG. 1 is a schematic view of an integrated circuit, arranged on a printed circuit board.

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements.

FIG. 1 generally shows an integrated circuit (IC) 100 which is arranged on a printed circuit board (PCB) 110. The printed circuit board 110 also comprises a power source 120, such as a battery, a switched power supply, etc, which serves to feed electric power to the integrated circuit 100 over power supply lines 130a, 130b at a set supply voltage. In the disclosed embodiments, the integrated circuit 100 is a digital Application-Specific Integrated Circuit (ASIC). The ASIC may be of a standard cell design, gate-array design, full-custom design, or structured design. While it is presently believed that the invention is particularly advantageous for implementation in and with an ASIC, it is conceivable that the integrated circuit 100, as an alternative, may be a Field-Programmable Gate Array (FPGA) or other kind of IC.

Figure 2:
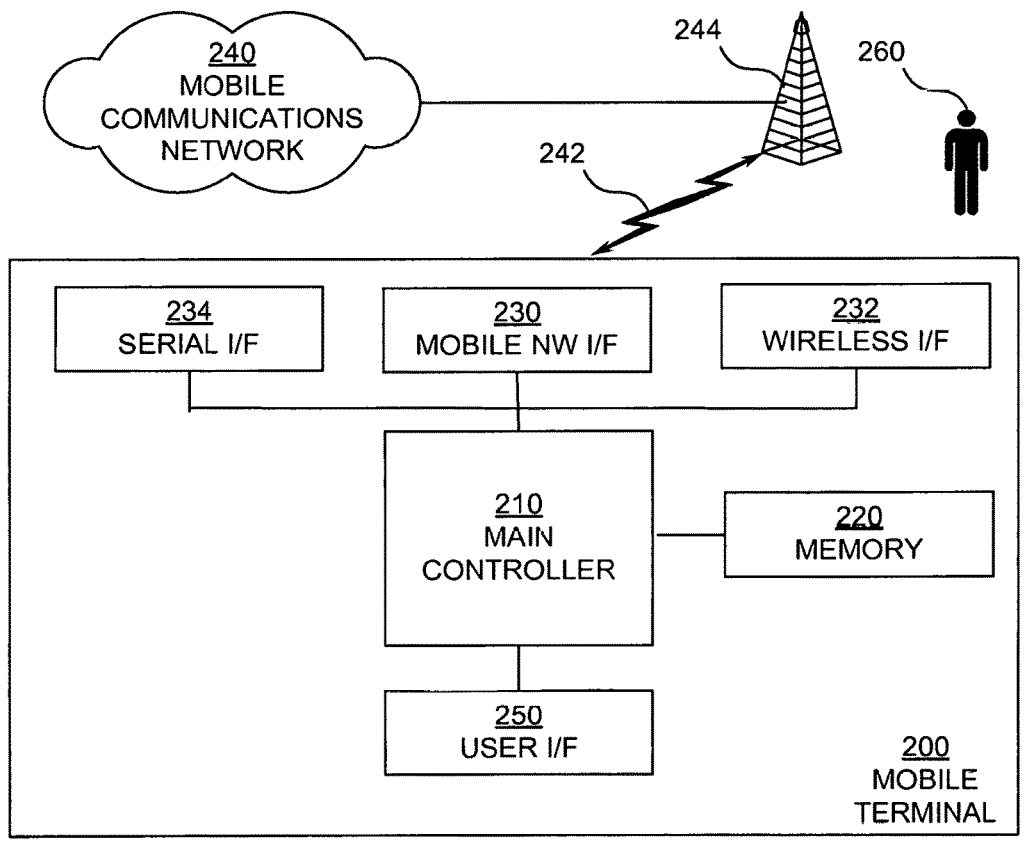
FIG. 2 is a schematic view of the components of a mobile terminal in which the integrated circuit of FIG. 1 may be used.

The integrated circuit 100 may be used in an electronic apparatus of arbitrary kind. One embodiment of such an electronic apparatus is schematically shown in FIG. 2 in the form of a mobile terminal 200. The mobile terminal 200 has a main controller 210 which has the overall responsibility for controlling the operation of the mobile terminal 200. In the disclosed embodiment, the main controller 210 is a central processing unit (CPU), but it can alternatively be a digital signal processor (DSP), or other programmable electronic logic device such as an application-specific integrated circuit (ASIC) or field-programmable gate array (FPGA).

In one embodiment, the integrated circuit 100 of FIG. 1 implements the main controller 210. In other embodiments, the integrated circuit 100 of FIG. 1 and the main controller 210 of FIG. 2 are separate implementations.

The main controller 210 is coupled to a memory 220 which may comprise a work memory and a storage memory. The memory 220 may for instance be implemented in the form of RAM, EEPROM, flash memory (e.g. memory card), magnetic hard disk, or any combination thereof. The memory 220 is capable of storing program code which is executable by the main controller 210 so as to cause performing of various functionality of the mobile terminal 200.

The mobile terminal 200 has a mobile network interface 230 which allows the mobile terminal 200 to communicate with a mobile communications network 240 over a wireless radio-frequency (RF) link 242 to a base station 244. The mobile network interface 230 comprises radio communication circuitry for communication pursuant to one or more standards for mobile telecommunication, such as, for instance, one or more of GSM, UMTS, LTE, D-AMPS, CDMA2000, FOMA or TD-SCDMA. Hence, the mobile network interface 230 comprises an internal or external antenna as well as a radio receiver and transmitter formed by band-pass filters, amplifiers, mixers, local oscillators, low-pass filters, AD/DA converters, etc.

In one embodiment, the integrated circuit 100 of FIG. 1 implements the mobile network interface 230. Hence, in this embodiment, the integrated circuit 100 comprises the aforementioned radio communication circuitry for communication pursuant to one or more standards for mobile telecommunication. This is seen more clearly in the embodiment 300 shown in FIGS. 3 to 5, where the radio communication circuitry is denoted 380.

In addition, the disclosed embodiment of the mobile terminal 200 has a wireless interface 232 which may be adapted for communication in accordance with one or more short-range wireless communication standards such as Bluetooth, WiFi (e.g. IEEE 802.11, wireless LAN), Near Field Communication (NFC), or Infrared Data Association (IrDA). The wireless interface 232 may be partly or fully integrated with the mobile network interface 230 in some embodiments. The disclosed embodiment of the mobile terminal 200 also has a wired interface 234, such as Universal Serial Bus (USB), which allows the mobile terminal 200 to communicate over a serial cable with for instance a personal computer. Such interfaces may be absent in other embodiments.

A user interface 250 allows a user 260 to interact with the mobile terminal 200. The user interface 250 includes display means, such as at least one LCD display, as well as input means for the user. The input means may e.g. include a keypad with alpha-numeric keys and/or other keys such as arrow keys (navigation keys) and functional keys (soft keys), and/or a joystick, touch pad, rotator, jog dial, etc. The display means and input means may be jointly realized by a touch-sensitive display in some embodiments. The user interface 250 typically also involves a loudspeaker and a microphone.

The mobile terminal 200 may also be provided with other well-known components, such as power switch, camera, battery, charger interface, accessory interface, and volume controls; such elements are however not indicated in FIG. 2 for the sake of brevity.

Figure 3:
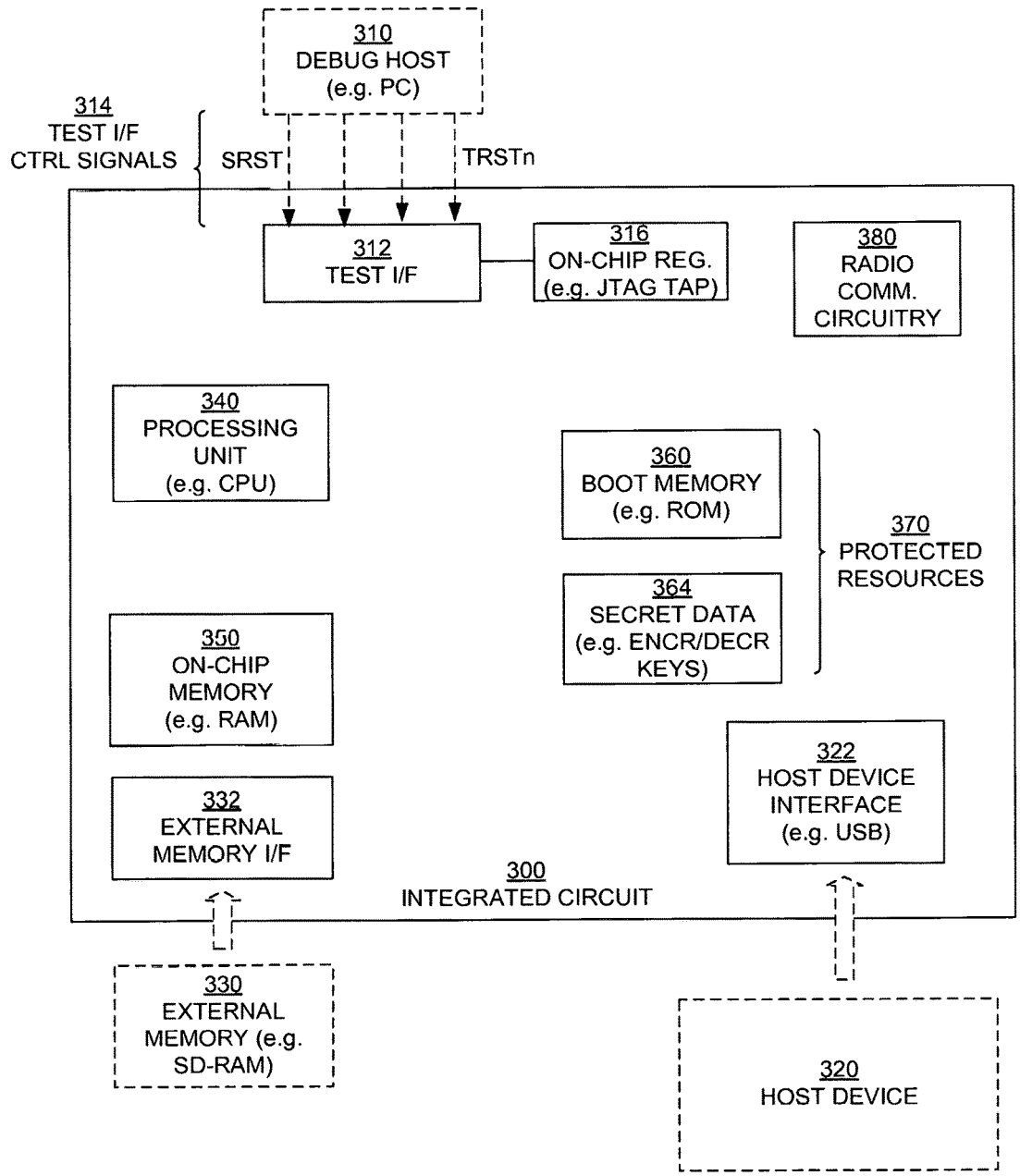
FIG. 3 is a schematic view of an embodiment of the integrated circuit of FIG. 1.

FIG. 3 illustrates a more detailed view of an embodiment 300 of the integrated circuit 100 shown in FIG. 1. As seen in FIG. 3, the integrated circuit 300 has a processing unit 340 which takes the role of a controller of other functional units of the integrated circuit 300. The processing unit 340 is associated with an on-chip memory 350, which may be a random access memory (RAM). The on-chip memory 350 may be used as a work memory for the processing unit 340 when performing the various functionality provided by the integrated circuit 300. The integrated circuit 300 also has an external memory interface 332 over which an external memory 330, such as an SD-RAM, may be read from and written to.

As already mentioned in conjunction with the description of FIG. 2, the embodiment of the integrated circuit 300 as shown in FIG. 3 comprises radio communication circuitry 380 for communication pursuant to one or more standards for mobile telecommunication. Hence, the integrated circuit 300 may advantageously be included in a mobile terminal, such as mobile terminal 200 of FIG. 2. The disclosed embodiment 300 of the integrated circuit is a digital System On Chip (SOC).

The integrated circuit 300 also has a test interface 312 through which a test operation mode of the integrated circuit 300 is controllable. To this end, an external debug host 310 (such as a personal computer, work station, etc) may be connected to the integrated circuit 300 for the purpose of performing debug of the various functionality provided by the integrated circuit 300.

In the disclosed embodiment, the test interface 312 is Joint Test Action Group (JTAG) compliant. To this end, the test interface 312 may, for instance, be an IEEE 1149.1 interface, or alternatively a compact IEEE 1149.7 interface (often referred to as cJTAG or Compact JTAG). As is generally well-known per se, the test operation mode may involve register scan testing, boundary scan testing or Functional Test Vectors (FTV) mode. As already explained in the Background section, for security reasons, certain protected resources on the integrated circuit are inaccessible in the test operation mode. Hence, while the on-chip memory 350 is accessible in the test operation mode as well as in the secure mission operation mode, the protected resources (which are generally referred to as 370 in FIG. 3) are inaccessible in the test operation mode. This means that the protected resources 370 cannot be accessed by the external debug host 310 in the test operation mode.

The protected resources 370 may include hardware elements, software elements or data elements, or any combination thereof.

A protected hardware element 370 may for instance be a secured memory area of the integrated circuit 300 (such as all or some part of a non-volatile boot memory 360), a radio frequency component (possibly included in the radio communication circuitry 380), a clock signal generator, an International Mobile Equipment Identity (IMEI) storage or a reset mechanism. In the exemplifying embodiment of FIGS. 3 to 5, the non-volatile boot memory 360 is illustrated as a protected hardware element by being graphically crossed out in the test operation mode according to FIG. 4.

A protected software element 370 may for instance be a debug function (for instance part of a debug procedure 362 which is defined by program code 362 stored in the non-volatile boot memory 360) or a Subscriber Identity Module (SIM) function.

A protected data element 370 may for instance be a Digital Rights Management (DRM) key, an IMEI, an encryption key (364) or a decryption key (364). In the exemplifying embodiment of FIGS. 3 to 5, secret data in the form of an encryption/decryption key pair 364 is illustrated as a protected data element by being graphically crossed out in the test operation mode according to FIG. 4.

Figure 4:
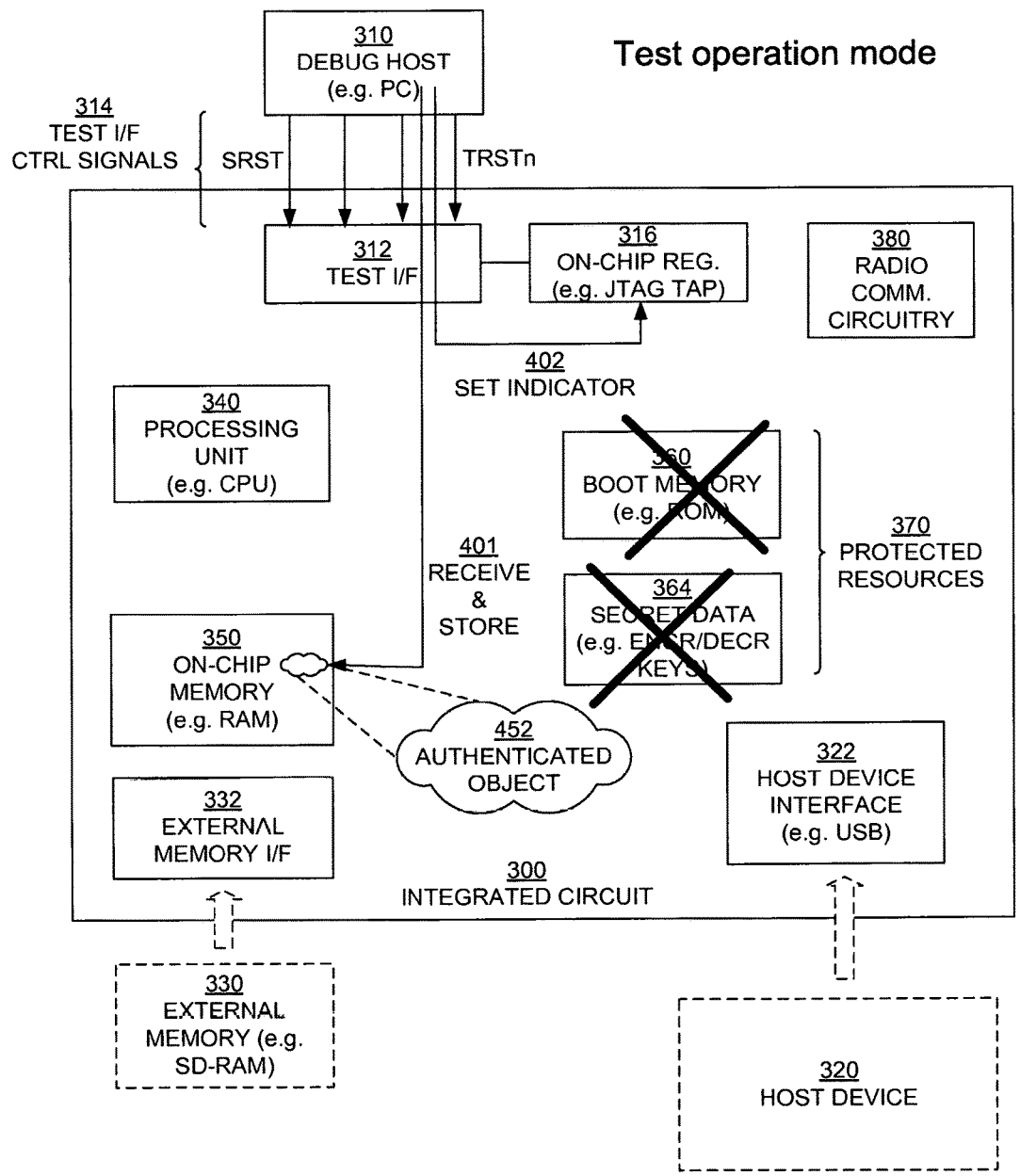
FIG. 4 illustrates the integrated circuit of FIG. 3 in a test operation mode.

A novel use of the test operation mode as a first phase for enabling secured debug of the integrated circuit 300 will be described in more detail with reference to FIG. 4

In addition, the integrated circuit 300 may operate in a secure mission operation mode. In the secure mission operation mode, the integrated circuit 300 may interact with an external host device 320 over a host device interface 322. As is generally well-known per se, the secure mission operation mode is different from the test operation mode and represents the normal and intended use of the integrated circuit 300 in its normal and intended environment in an electronic apparatus. In the disclosed embodiment, the electronic apparatus is the mobile terminal 200 of FIG. 2, and the external host device 320 is an application engine which includes the main controller 210 and associated memory 220 and provides an operating system like Android, iOS or Windows 8. As will be described in more detail with reference to FIG. 5, a second phase of the secured debug involves booting into the secure mission operation mode.

Figure 5:
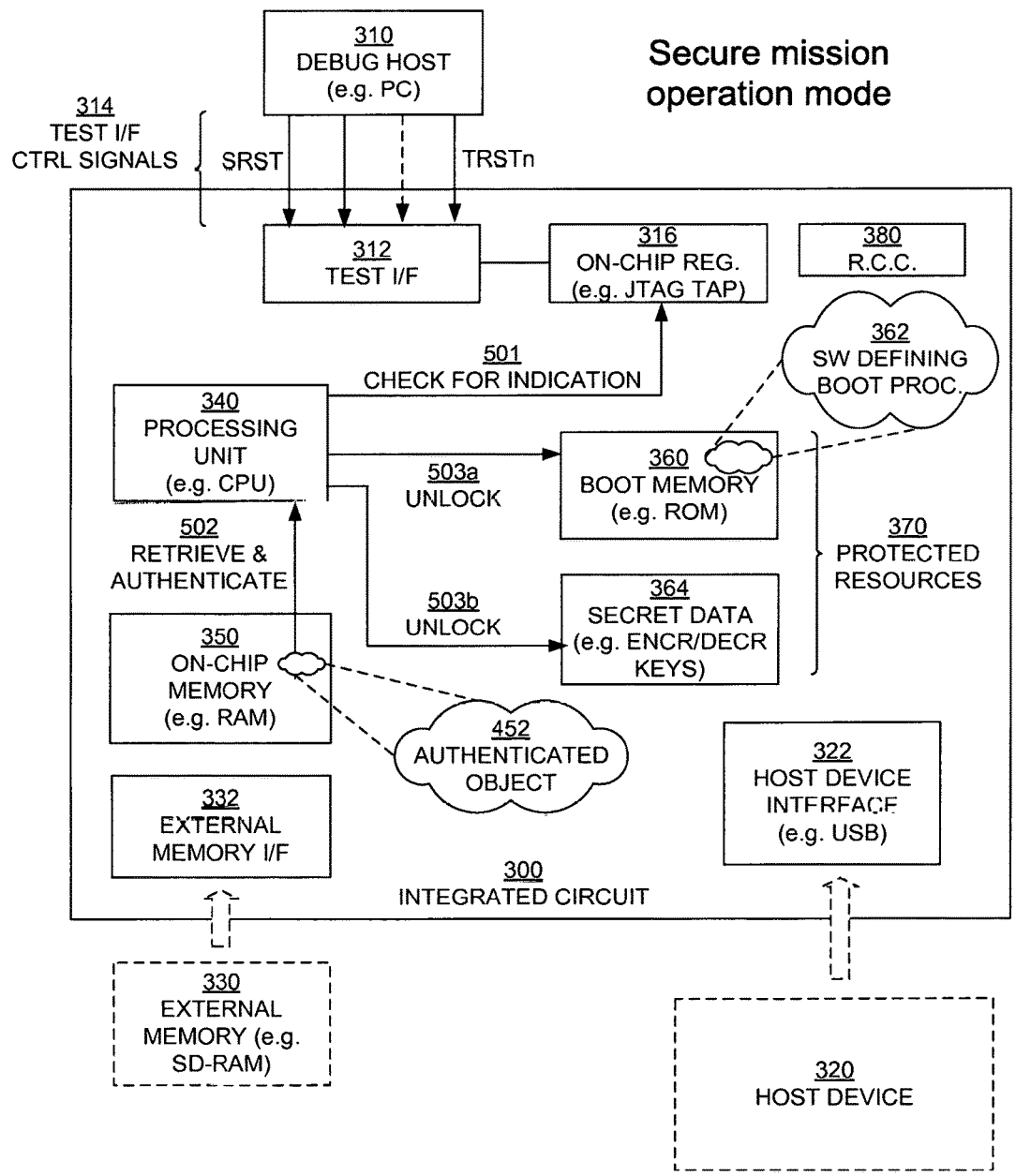
FIG. 5 illustrates the integrated circuit of FIG. 3 when booting in a secure mission operation mode.
Figure 6:
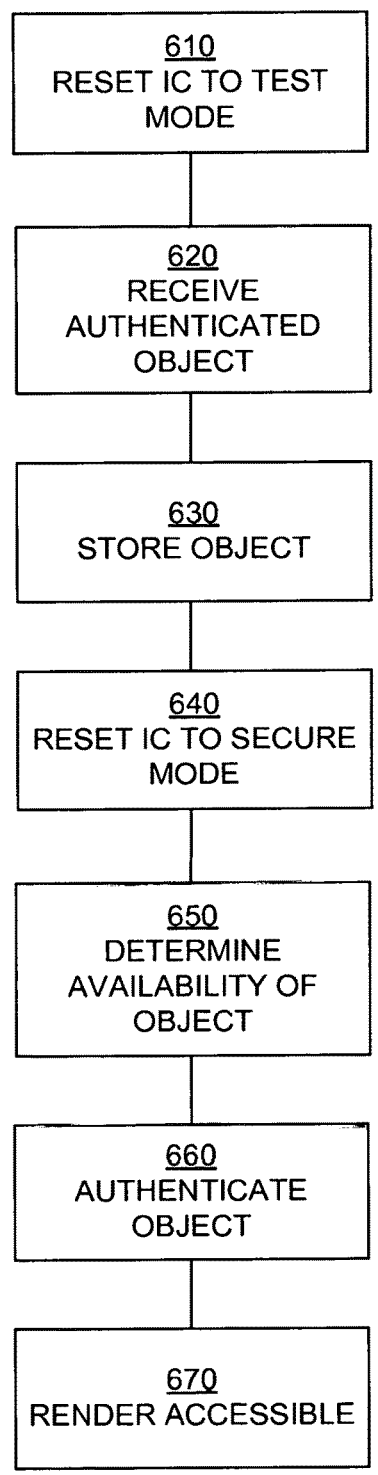
FIG. 6 shows a flowchart for a method for enabling secure boot of an integrated circuit.

Reference will now be made to FIG. 6, which illustrates a method for enabling secured debug of an integrated circuit. The description of the method will be made by exemplifying and non-limiting reference to the embodiment of the integrated circuit 300 described above for FIG. 3. To facilitate this description, FIGS. 4 and 5 are provided to illustrate the integrated circuit 300 in the test operation mode and in the secure mission operation mode, respectively.

In a first step 610 of the method for enabling secured debug, the debug host 310 resets the integrated circuit 300 to operate in the test operation mode. In the disclosed embodiment, the test operation mode is a Functional Test Vectors (FTV) mode. As already mentioned, the protected resources 370 of the integrated circuit 300 are inaccessible in the test operation mode. The reset may involve issuing particular control signals 314 over the test interface 312. For instance, one possible way is to first power on the integrated circuit 300 and let a JTAG control signal go active and then release it. Indications for FTV mode and POR (Power On Reset; a functional reset available in a JTAG Test Access Port (TAP)) (or alternatively SRST (System Reset; a hard-wire functional reset according to the IEEE 1149.1/7)) may be set in an on-chip register 316 which may be the JTAG top-level register commonly referred to as Top TAP. Upon subsequent release of the POR (or alternatively SRST), the integrated circuit 300 will be caused to enter the test operation mode which is illustrated in FIG. 4.

In a second step 620, an authenticated object 452 is received from the debug host 310 through the test interface 312. In a third step 630, the processing unit 340 stores the received authenticated object 452 in the on-chip memory 350. These activities are jointly seen at 401 in FIG. 4. The purpose of the authenticated object 452 is to allow the processing unit 340 to verify that the debug host 310 is a device which can be trusted to perform secured debug of the boot procedure 362 in the secure mission operation mode, including getting access to the protected resources 370.

The authenticated object 352 may for instance comprise authentication data identifying the debug host 310 as trusted. The authentication data may for instance take the form of a digital signature or certificate, the authenticity of which can be assessed by the processing unit 340.

Alternatively or additionally, the authenticated object 352 may comprise authorization data defining a permission to render any or all of the protected resources 360, 364, 370 accessible to the debug host 310. The authorization data may thus contain information specifying which of the protected resources 360, 364, 370 that are to be rendered accessible to the debug host 310.

Alternatively or additionally, the authenticated object 352 may comprise signed program code defining the debug procedure, or a function being a part thereof, to be executed by the processing unit 340 under control from the debug host 310. To this end, the signed program code may comprise a digital signature or certificate, the authenticity of which can be assessed by the processing unit 340.

To indicate that the authenticated object 452 has been stored in the on-chip memory 350, specific data, such as a flag or similar, may be written in the on-chip register 316. Conveniently, a JTAG TAP register is used as the on-chip register 316. This activity is seen at 402 in FIG. 4 and may take place while the integrated circuit 300 is still operating in the test operation mode, or alternatively after exit from the test operation mode. The specific data may be written either by the processing unit 340 or directly by the debug host 310 over the test interface 312.

In a fourth step 640, a functional reset of the integrated circuit 300 is performed so that it operates in the secure mission operation mode. The functional reset excludes (at least) the contents of the on-chip memory 350 now containing the authenticated object 452 and the flag or similar being held in the on-chip register 316. One possible way is to force the integrated circuit 300 to make a functional reset by removing the FTV mode indication while setting POR in the on-chip register 316 (JTAG Top TAP) (or alternatively SRST). Upon subsequent release of the POR (or alternatively SRST), the integrated circuit 300 will be caused to enter the secure mission operation mode which is illustrated in FIG. 5. This concludes the first phase of the method for enabling secured debug of the integrated circuit 300.

The second phase of the method for enabling secured debug will now be described with reference to FIGS. 5 and 6.

Upon reset into the secure mission operation mode, the processing unit 340 is configured to execute the aforementioned boot procedure 362. The boot procedure 362 involves steps 650 to 670 of FIG. 6. A fifth step 650 serves to determine that the authenticated object 452 is available in the on-chip memory 350. In the disclosed embodiment, this is done by the processing unit 340 checking for the presence of specific data in the on-chip JTAG TAP register 316. This checking activity is seen at 501 in FIG. 5. The processing unit 340 will find the specific data which was previously written into the on-chip JTAG TAP at 402 in FIG. 4, and will conclude that an authenticated object 452 is indeed available in the on-chip memory 350. The processing unit 340 retrieves the authenticated object 452 from the on-chip memory 350 (see activity 502 in FIG. 5), and proceeds to authenticate the authenticated object 452 in a sixth step 660 in FIG. 6.

The particulars of the authentication process may depend on the type of data included in the authenticated object 452. If the authenticated object 352 comprises authentication data identifying the debug host 310 as trusted, the authentication process may involve evaluating a digital signature or certificate, the authenticity of which indicates to the processing unit 340 that the debug host 310 can be trusted.

If the authenticated object 352 comprises authorization data defining a permission to render any or all of the protected resources 360, 364, 370 accessible to the debug host 310, the authentication process may involve analysis of information that specifies which of the protected resources 360, 364, 370 that are to be rendered accessible to the debug host 310.

If the authenticated object 352 comprises signed program code defining the debug procedure, or a function being a part thereof, the authentication process may involve evaluating a digital signature or certificate included with the program code. When the digital signature or certificate is found to be authentic, the processing unit 340 may trust the program code included in the authenticated object 352 and may then later execute it as a (part of) a debug procedure which is controlled by the debug host 310.

Upon successful authentication of the authenticated object 452 in step 660, a seventh step 670 involves rendering any or all of the protected resources 370 accessible to the debug host 310. In the disclosed embodiment, this involves unlocking the non-volatile boot memory 360 and the secret data 364, as illustrated by activities 503a and 503b in FIG. 5.

The debug host 310 will now be able to perform unrestricted debugging of the integrated circuit 300, including the protected resources 370, for the remainder of the boot and further. Security is preserved thanks to the two-stage procedure with down-loading and subsequent authentication of the authenticated object 352.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. An integrated circuit having a test operation mode and a secure mission operation mode, the integrated circuit comprising:
   a processing unit;
   a test interface through which the test operation mode is controllable;
   an on-chip memory, the on-chip memory being accessible in the test operation mode and in the secure mission operation mode;
   at least one protected resource, the at least one protected resource being inaccessible in the test operation mode;
   the processing unit being configured, in the test operation mode, to:
     receive an authenticated object through the test interface; and
     store the received authenticated object in the on-chip memory; and
   the processing unit being configured, upon reset into the secure mission operation mode, to execute a boot procedure to:
     determine that the authenticated object is available in the on-chip memory;
     authenticate the authenticated object; and
     upon successful authentication, render the at least one protected resources accessible to a debug host external to the integrated circuit.

2. The integrated circuit according to claim 1, wherein the test interface is Joint Test Action Group (JTAG) compliant.

3. The integrated circuit according to claim 2, wherein the test operation mode is a Functional Test Vectors (FTV) mode.

4. The integrated circuit according to claim 1, the integrated circuit being further configured to accept writing of specific data in an on-chip register to indicate that the authenticated object has been stored in the on-chip memory; and
   wherein the boot procedure checks the contents of the on-chip register and, upon finding of said specific data therein, determines that the authenticated object is available in the on-chip memory.

5. The integrated circuit according to claim 4, wherein the on-chip register is a JTAG Test Access Point (TAP) and the specific data is a flag.

6. The integrated circuit according to claim 1, further having a non-volatile boot memory, the boot memory being inaccessible in the test operation mode and accessible in the secure mission operation mode, wherein the boot memory comprises program code defining at least part of the boot procedure.

7. The integrated circuit according to according to claim 1, wherein the authenticated object comprises signed computer program code defining a debug procedure to be executed by the processing unit under control from the debug host.

8. The integrated circuit according to according to claim 1, wherein the authenticated object comprises authentication data identifying the debug host as trusted.

9. The integrated circuit according to according to claim 1, wherein the authenticated object comprises authorization data defining a permission to render the at least one protected resource accessible to the debug host.

10. The integrated circuit according to claim 1, wherein the at least one protected resource comprises at least one of:
a secured memory area of the integrated circuit;
a debug function;
a Digital Rights Management (DRM) key;
a Subscriber Identity Module (SIM) function;
an International Mobile Equipment Identity (IMEI) storage;
a radio frequency component;
an encryption key;
a decryption key;
a clock signal generator; and
a reset mechanism.

11. The integrated circuit according to claim 1, further comprising radio communication circuitry for communication pursuant to at least one standard for mobile telecommunication.

12. The integrated circuit according to claim 1, wherein the integrated is a digital System On Chip (SOC).

13. An electronic apparatus comprising an integrated circuit, the integrated circuit having a test operation mode and a secure mission operation mode, the integrated circuit comprising:
a processing unit;
a test interface through which the test operation mode is controllable;
an on-chip memory, the on-chip memory being accessible in the test operation mode and in the secure mission operation mode;
at least one protected resource, the at least one protected resource being inaccessible in the test operation mode;
the processing unit being configured, in the test operation mode, to:
receive an authenticated object through the test interface; and
store the received authenticated object in the on-chip memory; and
the processing unit being configured, upon reset into the secure mission operation mode, to execute a boot procedure to:
determine that the authenticated object is available in the on-chip memory;
authenticate the authenticated object; and
upon successful authentication, render the at least one protected resources accessible to a debug host external to the integrated circuit.

14. A mobile terminal comprising an integrated circuit, the integrated circuit having a test operation mode and a secure mission operation mode, the integrated circuit comprising:
a processing unit;
a test interface through which the test operation mode is controllable;
an on-chip memory, the on-chip memory being accessible in the test operation mode and in the secure mission operation mode;
at least one protected resource, the at least one protected resource being inaccessible in the test operation mode;
radio communication circuitry for communication pursuant to at least one standard for mobile telecommunication;
the processing unit being configured, in the test operation mode, to:
receive an authenticated object through the test interface; and
store the received authenticated object in the on-chip memory; and
the processing unit being configured, upon reset into the secure mission operation mode, to execute a boot procedure to:
determine that the authenticated object is available in the on-chip memory;
authenticate the authenticated object; and
upon successful authentication, render the at least one protected resources accessible to a debug host external to the integrated circuit.

15. A method of enabling secured debug of an integrated circuit, the method comprising:
resetting the integrated circuit to operate in a test operation mode in which at least one protected resource of the integrated circuit is inaccessible;
receiving an authenticated object through a test interface of the integrated circuit;
storing the received authenticated object in an on-chip memory of the integrated circuit; and
resetting the integrated circuit to operate in a secure mission operation mode by executing a boot procedure, the boot procedure comprising:
determining that the authenticated object is available in the on-chip memory;
authenticating the authenticated object; and
upon successful authentication, rendering the at least one protected resource accessible to a debug host external to the integrated circuit.

16. The method according to claim 15, wherein the authenticated object is received over the test interface from the debug host.

17. The method according to claim 15, further comprising:
accepting writing of specific data in an on-chip register to indicate that the authenticated object has been stored in the on-chip memory; and
in the secure mission operation mode, checking the contents of the on-chip register to determine that the authenticated object is available in the on-chip memory.

18. The method according to claim 15, wherein the step of resetting the integrated circuit to operate in the test operation mode and the step of resetting the integrated circuit to operate in the secure mission operation mode are performed in response to receiving respective control signals from the debug host over the test interface.

19. The integrated circuit according to claim 3, further configured to accept writing of specific data in an on-chip register to indicate that the authenticated object has been stored in the on-chip memory; and wherein the boot procedure checks the contents of the on-chip register and, upon finding of said specific data therein, determines that the authenticated object is available in the on-chip memory.

20. The integrated circuit according to according to claim 8, wherein the authenticated object comprises authorization data defining a permission to render the at least one protected resource accessible to the debug host.

* * * * *